June 19, 1956
E. EBERHARD
2,751,501
TRANSISTOR OSCILLATOR
Filed Dec. 24, 1954
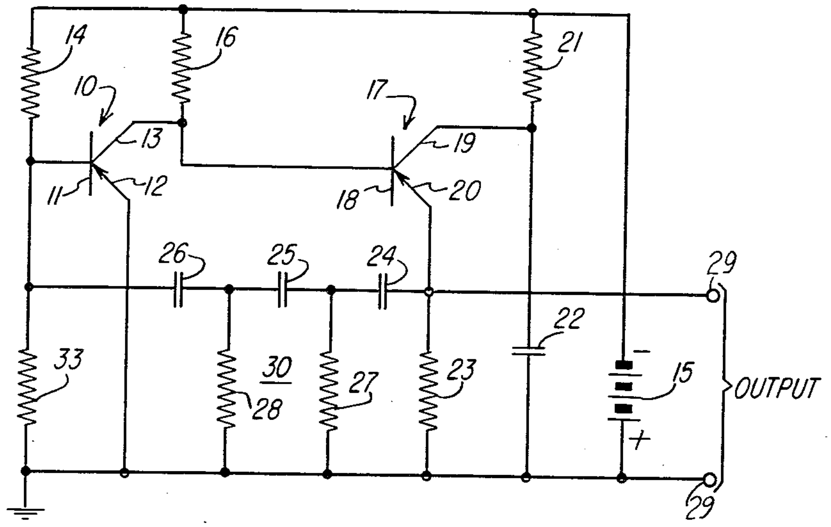
INVENTOR.
Everett Eberhard
BY
Mueller & Aichele
Attys.

2,751,501
Patented June 19, 1956

2,751,501

TRANSISTOR OSCILLATOR

Everett Eberhard, Phoenix, Ariz., assignor to Motorola, Inc., Chicago, Ill., a corporation of Illinois Application December 24, 1954, Serial No. 477,511
6 Claims. (Cl. 250—36)

The present invention relates to oscillator circuits and more particularly to an improved transistor oscillator of the resistance-capacity phase-shift type.

Resistance-capacity phase-shift oscillators using electron tubes have proved extremely useful in the past, especially for generating voltages in the audio frequency range. The adaptation of the phase-shift oscillator to the use of transistors clearly represents an advantageous step in the art so that the desirable features and characteristics of transistors can be taken advantage of in this type of circuit. However, this adaptation is not readily apparent due to the problems that arise from the usually low input impedance and high output impedance of a transistor when it is biased for normal operation. It has been found that the impedance of the phase-shifting network in the transistor phase-shift oscillator must be relatively low at the operating frequency if oscillation is to be sustained in the oscillator circuit. This is probably due to the fact that the impedance presented by the input electrodes of the transistor is relatively low; and if this input impedance is equal or lower than the output impedance of the phase-shifting network, the frequency of oscillation is affected by slight variations in the input impedance of the transistor which leads to frequency instability if not complete oscillation suppression. Therefore, it is desirable if not essential that the impedance of the phase-shifting network be as low as possible. This being the case, the problem of matching this low impedance of the phase-shifting network with the high output impedance of the transistor for efficient energy transfer remains to be solved.

It is, accordingly, an object of the present invention to provide an improved transistor phase-shift type oscillator in which the problems outlined above are successfully overcome.

A further object of the invention is to provide such an improved phase-shift transistor oscillator that is simple and economical in its construction and which is highly stable and efficient in its operation.

A feature of the invention is the provision of a second transistor in a transistor phase-shift oscillator which functions as an impedance matching device, so that the feedback phase-shifting circuit can have a relatively low impedance for the reasons outlined previously herein.

Another feature of the invention is the provision in a phase-shift oscillator of a first transistor functioning as a voltage amplifier and a second transistor functioning as an impedance matching device, with the first transistor being biased and the circuit connected to exhibit relatively low input impedance and relatively high output impedance and with the second transistor being biased and the circuit connected to exhibit relatively high input impedance and relatively low output impedance.

The above and other features of the invention which are believed to be new are set forth with particularity in the appended claims. The invention itself, however, together with further objects and advantages thereof, may best be understood by reference to the following description when taken in conjunction with the accompanying drawing in which the single figure shows a transistor phase-shift resistance-capacitance oscillator circuit constructed in accordance with the invention.

The invention provides a phase-shift type transistor oscillator circuit which comprises a first transistor having an input electrode, an output electrode and a common electrode. A first transistor is suitably biased so that the impedance between the common electrode and input electrode is relatively low as compared with the impedance between the output electrode and common electrode. An input circuit is coupled between the common and input electrodes. The oscillator also includes a second transistor having an input electrode, an output electrode and a common electrode. The second transistor is biased so that the impedance between its input electrode and common electrode is high compared with the impedance between its output electrode and common electrode. A coupling network is connected between the output and common electrodes of the first transistor and includes the input and common electrodes of the second transistor, and an output circuit is connected between the output and common electrodes of the second transistor. A resistance-capacitance phase-shifting feedback circuit is connected from the output circuit of the second transistor to the input circuit to sustain oscillation in the oscillator at a frequency determined by the parameters of the feedback circuit.

The transistor oscillator of the present invention includes a first transistor 10 which includes an input base electrode 11, a common emitter electrode 12 and an output collector electrode 13. The emitter 12 is connected to a point of reference potential or ground, and the base 11 is connected to the point of reference potential through a resistor 33. The base is also connected through a resistor 14 to the negative terminal of a source 15 of unidirectional biasing potential, the positive terminal of this source being connected to the point of reference potential. The collector 13 of transistor 10 is connected through a resistor 16 to the negative terminal of source 15.

Transistor 10 is connected as a voltage transistor amplifier of the grounded or common emitter type. The input signal is impressed between the base and emitter, and an output signal from the first transistor is obtained from between the collector and emitter electrodes across resistor 16. The transistor is biased so that the input or base electrode exhibits a relatively low impedance with the common emitter, and so that the collector or output electrode exhibits a relatively high impedance with the common emitter 12. This biasing is achieved by source 15 in conjunction with resistors 33, 14 and 16.

The oscillator also includes a second transistor 17 which has an input base electrode 18, a common collector electrode 19 and an output emitter electrode 20. Transistor 17 is connected as a common collector arrangement, and the signal from transistor 10 is impressed between the base and collector electrodes, while the output signal is derived from between the emitter and common collector electrodes. The base electrode of transistor 17 is directly connected to the collector electrode 13 of transistor 10. The collector electrode 19 of transistor 17 is connected to the negative terminal of source 15 through a resistor 21 and is effectively connected to ground for audio frequencies through a capacitor 22. Emitter electrode 20 of transistor 17 is connected to ground through a resistor 23. Emitter electrode 20 is further coupled to the base electrode 11 of transistor 10 through a resistance-capacity phase-shifting feedback network 30 including three series-connected capacitors 24, 25 and 26, the junction of capacitors 24 and 25 being connected through a resistor 27 to ground and the junction of capacitors 25 and 26 being connected through a resistor 28 to ground. A pair of output terminals 29 is connected across resistor 23.

As previously noted, transistor 17 is connected as a common collector circuit. The signal from transistor 10, appearing in the coupling circuit including resistor 16, is impressed between the base and collector electrodes 18, 19 of transistor 17. The transistor 17 is biased so that the impedance between electrodes 18, 19 is relatively high as compared with the impedance between the emitter electrode 20 and collector electrode 19 across which the output circuit including resistor 23 is effectively connected. The output signal from transistor 17 appears across resistor 23 in phase with the output signal from transistor 10 appearing across resistor 16, that is, there is no phase reversal in transistor 17. Feedback network 30 produces a 180° phase shift only at a selected frequency which is determined by the constants of the elements in this network. It is only at that selected frequency, therefore, that the signal fed back to the input circuit including resistor 33 of transistor 10 has the proper frequency to sustain oscillation and supply an output signal of the selected frequency to terminals 29.

The phase-shifting network 30 has a relatively low impedance which, as previously noted, is essential for stable oscillating conditions since, otherwise, slight variations in the low input impedance of transistor 10 would produce material effects on the oscillator operation. Transistor 10 functions as a voltage amplifier and supplies an amplified signal to transistor 17. Transistor 17 is not a voltage amplifier and functions only as an impedance matching device for matching the high output impedance of transistor 17 to the low input impedance of the feedback network 30.

The selected frequency at which the oscillator is to oscillate can be set or adjusted by varying the values of capacitors 24, 25 and 26, or by adjusting resistors 33, 23, 27 or 28. Transistor 17 is preferably of the junction type, although transistor 10 may be either of the junction or the point contact type.

In a constructed embodiment of the invention, the following circuit constants were used, and these are listed herein merely by way of example and are not intended to limit the invention in any way:

| | | |
|---|---|---|
| Resistor **33** | ohms | 15,000 |
| Resistor **14** | do | 220,000 |
| Resistor **16** | do | 5,600 |
| Resistor **21** | do | 5,600 |
| Resistor **23** | do | 8,200 |
| Resistor **27** | do | 3,300 |
| Resistor **28** | do | 3,300 |
| Capacitor **24** | microfarads | .01 |
| Capacitor **25** | do | .01 |
| Capacitor **26** | do | .033 |
| Bias source **15** | volts | 10.4 |

With the above parameters, the oscillator was found to oscillate with a high degree of stability at an oscillating frequency of 1.1 kilocycles.

The invention provides, therefore, a simple and highly stable transistor oscillator of the resistance-capacity type which is eminently suitable as a generator of audio frequency voltages, and for any other uses to which resistance-capacity oscillators are generally put.

I claim:

1. A phase-shift type oscillator circuit including in combination a first transistor having base, emitter and collector electrodes; means connecting said emitter electrode to a point of reference potential; first resistor means connecting said base electrode to said point of reference potential; biasing means for providing a unidirectional potential with respect to said point of reference potential; second resistor means connecting said collector electrode to said biasing means; a second transistor having base, emitter and collector electrodes; means connecting said collector electrode of said first transistor to said base electrode of said second transistor; third resistor means connecting said emitter electrode of said second transistor to said point of reference potential; means connecting said collector electrode of said second transistor to said biasing means, and a resistance-capacity phase-shifting feedback network connected between said first and third resistor means for providing a 180° phase shift to a signal of a selected frequency appearing across said third resistor means and for applying the shifted signal to said first resistor means so as to sustain oscillation in the oscillator at such selected frequency.

2. A phase-shift type oscillator circuit including in combination a first transistor having first, second and third electrodes; means connecting said first electrode to a point of reference potential; first resistor means connecting said second electrode to said point of reference potential; second resistor means connecting said third electrode to a first terminal of a unidirectional potential biasing source, a second terminal of said source being connected to said point of reference potential; a second transistor having first, second and third electrodes; means connecting said third electrode of said first transistor to said first electrode of said second transistor; third resistor means connecting said second electrode of said second transistor to said point of reference potential; means connecting said third electrode of said second transistor to said first terminal of said source; and a phase-shifting feedback network connected between said first and third resistor means for providing a 180° phase shift to a signal of a selected frequency appearing across said third resistor means and for applying the shifted signal to said first resistor means to sustain oscillation in the oscillator at such selected frequency.

3. A phase-shift type oscillator circuit including in combination a first transistor having an input electrode, an output electrode and a common electrode, with said common electrode being biased to exhibit relatively low impedance with said input electrode and relatively high impedance with said output electrode; an input circuit coupled between said common electrode and input electrode; a second transistor having an input electrode, an output electrode and a common electrode, with said common electrode of said second transistor being biased to exhibit relatively high impedance with said input electrode thereof and relatively low impedance with said output electrode thereof; a coupling circuit connected between said output electrode and common electrode of said first transistor and including said input electrode and common electrode of said second transistor; an output circuit connected between said output electrode and common electrode of said second transistor; and a phase-shifting feedback circuit coupled from said output circuit to said input circuit and producing a 180° phase shift at a selected frequency to sustain oscillation in the oscillator at such selected frequency.

4. A phase-shift oscillator circuit such as defined in claim 3 and in which said phase-shifting feedback circuit includes resistance means and capacitance means whose values determine said selected frequency.

5. A phase-shift type oscillator circuit including in combination a first transistor having a base electrode, a collector electrode and an emitter electrode, with said emitter electrode being biased to exhibit relatively low impedance with said base electrode and relatively high impedance with said collector electrode; an input circuit coupled between said emitter and said base electrode; a second transistor having a base electrode, an emitter electrode and a collector electrode, with said collector electrode of said second transistor being biased to exhibit relatively high impedance with said base electrode thereof and relatively low impedance with said emitter electrode thereof; a coupling circuit coupled between said collector electrode and emitter electrode of said first transistor and including said base electrode and collector electrode of said second transistor; an output circuit coupled between said collector electrode and emitter electrode of said second transistor; and a resistance-capacity phase-shifting feedback circuit coupled from said output circuit to said input circuit and producing a 180° phase shift at a selected frequency to sustain oscillation in the oscillator at such selected frequency.

6. A phase-shift type oscillator circuit including in combination a first transistor having a common emitter electrode effectively connected to a point of reference potential for alternating currents, a base electrode and a collector electrode; means for biasing said first transistor so that said emitter electrode exhibits relatively low impedance with said base electrode and relatively high impedance with said collector electrode; an input circuit coupled between said base electrode and said point of reference potential; a second transistor having a common collector electrode effectively connected to said point of reference potential for alternating currents, a base electrode and an emitter electrode; means for biasing said second transistor so that said collector electrode thereof exhibits relatively high impedance with said base electrode thereof and relatively low impedance with said emitter electrode thereof; a coupling network interposed between said first and second transistors and including said collector electrode of said first transistor and said base electrode of said second transistor; an output circuit for said second transistor coupled between said emitter electrode thereof and said point of reference potential; and a phase-shifting feedback circuit coupled between said output and input circuits and producting a 180° phase shift at a selected frequency to sustain oscillation in the oscillator at such selected frequency.

References Cited in the file of this patent

UNITED STATES PATENTS 2,556,296 Rack ------------------- June 11, 1951